(12) United States Patent
Chang et al.

(10) Patent No.: US 9,263,141 B2
(45) Date of Patent: Feb. 16, 2016

(54) METHODS FOR ERASING, READING AND PROGRAMMING FLASH MEMORIES

(71) Applicant: Integrated Silicon Solution (Shanghai), Inc., Shanghai (CN)

(72) Inventors: Yoh Tz Chang, Shanghai (CN); Kai Tao, Shanghai (CN)

(73) Assignee: INTEGRATED SILICON SOLUTION (SHANGHAI), INC., Shanghai (CN)

( * ) Notice: Subject to any disclaimer, the term of this patent is extended or adjusted under 35 U.S.C. 154(b) by 0 days.

(21) Appl. No.: 14/493,370

(22) Filed: Sep. 23, 2014

(65) Prior Publication Data

US 2015/0103603 A1 Apr. 16, 2015

(30) Foreign Application Priority Data

Oct. 11, 2013 (CN) .......................... 2013 1 0473408

(51) Int. Cl.
*G11C 16/04* (2006.01)
*G11C 16/10* (2006.01)
*G11C 5/06* (2006.01)
*G11C 5/02* (2006.01)
*G11C 16/02* (2006.01)
*G11C 16/14* (2006.01)
*G11C 16/26* (2006.01)
(Continued)

(52) U.S. Cl.
CPC ............ *G11C 16/14* (2013.01); *G11C 16/0425* (2013.01); *G11C 16/26* (2013.01); *G11C 16/3418* (2013.01); *G11C 5/02* (2013.01); *G11C 5/06* (2013.01); *G11C 16/0466* (2013.01); *G11C 16/10* (2013.01); *G11C 16/12* (2013.01)

(58) Field of Classification Search
CPC ............... G11C 16/10; G11C 16/0466; G11C 11/5671; G11C 16/12; G11C 5/02; G11C 5/06
USPC ............. 365/185.05, 185.28, 185.33, 185.11, 365/63, 51
See application file for complete search history.

(56) References Cited

U.S. PATENT DOCUMENTS 5,862,082 A * 1/1999 Dejenfelt .............. H01L 27/115 257/E27.103
6,434,053 B1 * 8/2002 Fujiwara ............ G11C 16/0466 257/324

(Continued)

*Primary Examiner* — Ly D Pham
(74) *Attorney, Agent, or Firm* — Jun He Law Offices P.C.; Zhaohui Wang

(57) ABSTRACT

The present invention relates to semiconductor technology, and provides methods for erasing, reading and programming a flash memory. In the present invention, when an erase operation is performed on the flash memory, for a sector selected for the erase operation, its N-type well is applied with a voltage of 8V~12V, its bit line is applied with a voltage of 4V~6V, and its word line is applied with a voltage of −7V~−10V. When a read operation is performed on the flash memory, for a sector selected for the read operation, its N-type well is applied with a VCC voltage; for a flash memory cell selected for the read operation, its bit line is applied with the VCC voltage, and its source line is applied with a voltage of 0V. When a program operation is performed on the flash memory, for a flash memory cell selected for the program operation, its bit line is applied with a voltage of VCC−6.5V~VCC−4.5V, and its bit line is applied with a voltage of VCC+6V~VCC+9V. In full consideration of factors including the chip manufacturing process, chip circuit design, chip quality and cost, optimal operating conditions fit for erasing, reading and programming, a NOR-type embedded 2T PMOS flash memory are determined.

10 Claims, 5 Drawing Sheets

(51) Int. Cl.
  *G11C 16/34* (2006.01)
  *G11C 16/12* (2006.01)

(56) References Cited

U.S. PATENT DOCUMENTS

| | | | | |
|---|---|---|---|---|
| 2008/0290401 A1* | 11/2008 | Yasui | G11C 16/0425 | 257/324 |
| 2009/0065849 A1* | 3/2009 | Noda | C23C 16/345 | 257/324 |
| 2009/0173934 A1* | 7/2009 | Jain | G11C 11/56 | 257/20 |
| 2012/0087192 A1* | 4/2012 | Fang | G11C 16/10 | 365/185.19 |
| 2012/0176841 A1* | 7/2012 | Lee | G11C 16/0441 | 365/185.17 |

* cited by examiner

METHODS FOR ERASING, READING AND PROGRAMMING FLASH MEMORIES

CROSS-REFERENCE TO RELATED APPLICATIONS

This application claims priority from Chinese Patent Application No. 201310473408.6, filed on Oct. 11, 2013, the entire contents of which are incorporated herein by reference.

TECHNICAL FIELD

The present disclosure generally relates to semiconductor devices, and more particularly, to technologies for erasing, reading and programming flash memories.

BACKGROUND

Embedded flash memories are typically integrated into a system chip such as a subscriber identity module (SIM) card chip or a smart card chip in form of an intellectual property (IP) core. Thus, the embedded flash memories are different from stand-alone flash memory products due to their embedded feature.

An embedded flash memory array typically uses the NOR structure (as shown in FIG. 1) to ensure random access operation. A bit line (BL) shown in FIG. 1 is used to control a voltage of a drain of a transistor. A word line (WL) is used to control a voltage of a gate of the transistor. A source line is used to control a voltage of a source of the transistor. In the circuit shown in FIG. 1, any one of flash memory cells in the flash memory array can be read by controlling the bit line, word line and source line together. Taking a NMOS flash memory for example, if it is required to read out data stored in a flash memory cell marked by a circle shown in FIG. 1, the word line corresponding to the marked flash memory cell is pulled up (the other word lines are grounded), the bit line corresponding to the marked flash memory cell is pulled up (the other bit lines are grounded), and all the source lines are grounded. Correspondingly, only data stored in the marked flash memory cell can be read out, while the other flash memory cells can not output data due to the grounded gates or a zero-voltage difference between their bit line and source line.

U.S. Pat. No. 5,912,842 discloses a 2-transistor (2T) positive metal oxide semiconductor (PMOS) flash memory. A flash memory cell for storing data in the 2T PMOS flash memory includes a select gate PMOS transistor and a control gate PMOS transistor having a floating gate, and the two transistors are coupled in series.

The PMOS transistor is an elementary device for the modern very large scale integrated (VLSI) circuits. The PMOS transistor typically has four control nodes including a gate node, a drain node, a source node and a bulk node. The transistor can be turned on or off by controlling the voltages applied to these four nodes. The select gate transistor is typically coupled in series with the control gate transistor to form a 2T flash memory cell. The operation on the 2T flash memory cell with a specific address can be selected or cancelled by controlling the select gate transistor. The control gate transistor is a cell that stores "0/1". For example, specific operations may be performed onto the transistor such that it may have different electric characteristics (e.g., different threshold voltages) representing "0" or "1", respectively. The floating gate is usually embedded between the control gate and the silicon substrate of the control gate transistor to form a sandwich structure. In the embedded 2T PMOS flash memory, the floating gate and the control gate are separated by an oxide-nitride-oxide dielectric film, and the floating gate and the silicon substrate are separated by an oxide dielectric film. The floating gate is N-type or P-type doped polysilicon in which charges can be stored so as to change the electric characteristics of the control gate PMOS transistor.

An erase operation generally refers to an operation for "erasing data" in the flash memory products. For the embedded PMOS flash memories of the present invention, the erase operation generally utilizes the Fowler-Nordheim (FN) tunneling effect to discharge the electrons stored within the floating gate to increase the threshold voltage of the control gate transistor, such that the flash memory cell operated presents data "1" when read by an external circuit.

A program operation generally refers to an operation for "programming data" in the flash memory products. For the embedded PMOS flash memories of the present invention, the program operation generally uses the band-band hot electron injection (BBHE) effect to inject electrons into the floating gate to lower the threshold voltage of the control gate transistor, such that the flash memory cell operated presents data "0" when read by the external circuit.

An erase disturb refers that, when data associated with certain address is erased, data associated with some other addresses are mistakenly changed.

A read disturb refers to that, when data associated with certain address is read, data associated with some other addresses are mistakenly changed.

A program disturb refers to that, when data associated with certain address is programmed, data associated with some other addresses are mistakenly changed.

In order to perform the erase, read or program operation onto the flash memory products, it is required to make the operating conditions match with the characteristics of the devices, satisfy with the performance of the devices and avoid negative influence on the reliability of the flash memory products. A lot of time and financial cost, as well as fully considering the influence of factors including chip production process, chip circuit design, chip device characteristics, chip quality and chip costs, are required to determine a set of optimal operating conditions.

SUMMARY

An objective of the present invention is to provide method for erasing, reading and programming flash memories. Optimal operating conditions for erasing, reading and programming an NOR-type embedded 2T PMOS flash memory are formulated in full consideration of the influence of factors including chip production process, chip circuit design, chip device characteristics, chip quality and chip costs.

In an embodiment of the present invention, there is disclosed a method for erasing a flash memory comprising an array of at least one sector, each sector comprising an N-type well and a plurality of flash memory cells coupled in a matrix in the N-type well, wherein each flash memory cell comprises a select gate PMOS transistor and a control gate PMOS transistor with a floating gate, and a first electrode of the select gate PMOS transistor is coupled to a second electrode of the control gate PMOS transistor; in the matrix coupled by the flash memory cells, the second electrodes of the select gate PMOS transistors in the same column are coupled together to form a first control line, and gates of the control gate PMOS transistors in the same row are coupled together to form a second control line; and the select gate PMOS transistor has a gate oxide layer with a thickness of 8 nm to 11 nm and a channel with a length of 100 nm to 300 nm; the control gate PMOS transistor has a gate oxide with a thickness of 8 nm to 11 nm, an ONO thin film dielectric layer with a thickness of 10 nm to 20 nm and a channel with a length of 100 nm to 300 nm. The method comprises: when performing an erase operation, applying a voltage of 8 to 12 V to the N-type well of a sector selected for the erase operation, a voltage of 4 to 6 V to the first control line of the selected sector and a voltage of −10 to −7 V to the second control line of the selected sector; wherein the first electrode is a source and the second electrode is a drain, or the first electrode is the drain and the second electrode is the source.

In an embodiment of the present invention, there is disclosed a method for reading a flash memory comprising an array of at least one sector, each sector comprising an N-type well and a plurality of flash memory cells coupled in a matrix in the N-type well, wherein each flash memory cell comprises a select gate PMOS transistor and a control gate PMOS transistor with a floating gate, and a first electrode of the select gate PMOS transistor is coupled to a second electrode of the control gate PMOS transistor; the second electrodes of the select gate PMOS transistors in the same column in the matrix coupled by the flash memory cells are coupled together to form a first control line, and the first electrodes of the control gate PMOS transistors in each sector is coupled together to form a fourth control line. The method comprises: when performing a read operation, applying a VCC voltage to the first control line of the flash memory cell selected for the read operation, and a voltage of 0V to the fourth control line of the selected flash memory cell; wherein the first electrode is a source and the second electrode is a drain, or the first electrode is the drain and the second electrode is the source.

In an embodiment of the present invention, there is disclosed a method for programming a flash memory comprising an array of at least one sector, each sector comprising an N-type well and a plurality of flash memory cells coupled in a matrix in the N-type well, wherein each flash memory cell comprises a select gate PMOS transistor and a control gate PMOS transistor with a floating gate, and a first electrode of the select gate PMOS transistor is coupled to a second electrode of the control gate PMOS transistor; in the matrix coupled by the flash memory cells, the second electrodes of the select gate PMOS transistors in the same column are coupled together to form a first control line, and gates of the control gate PMOS transistors in the same row are coupled together to form a second control line; and the select gate PMOS transistor has a gate oxide layer with a thickness of 8 nm to 11 nm and a channel with a length of 100 nm to 300 nm; the control gate PMOS transistor has a gate oxide with a thickness of 8 nm to 11 nm, an ONO thin film dielectric layer with a thickness of 10 nm to 20 nm and a channel with a length of 100 nm to 300 nm. The method comprises: when performing a program operation, applying to the first control line of a flash memory cell selected for the program operation a voltage ranging from a VCC voltage minus 6.5 V to the VCC voltage minus 4.5 V, and the VCC voltage plus 6 V to the VCC voltage plus 9 V to the second control line of the selected flash memory cell; wherein the first electrode is a source and the second electrode is a drain, or the first electrode is the drain and the second electrode is the source.

Compared with the conventional techniques, the embodiments of the present invention have the following main distinctions and benefits:

The present invention provides optimal operating methods fit for the NOR-type embedded 2T PMOS flash memory. The formulation of the operating methods experiences 20-years continued investment, which requires a lot of time and financial costs. The influence of many factors are considered, including chip production process, chip circuit design, chip device characteristics, chip quality and chip cost. The main factors includes:

1. The optimization of the operating conditions in the method for operating the flash memory are based on the production process node of flash memories. Taking the 0.18 um embedded PMOS flash memory for example, at least 3-5 sets of masks (60,000 USD per set) and 300 to 500 pieces of 8 inch silicon wafer (1,000 USD per piece) are required from creating the technical node process to fix the process conditions, which takes an investment over 480,000 USD. It generally takes 2 to 3 years to develop the process. The labor cost is 300 to 450 thousand USD a year (10 to 15 persons), and therefore the total labor cost is at least 600 thousand USD. To sum up, the total cost for optimizing the operating condition for the 0.18 um embedded PMOS flash memory process node exceeds 1 million USD. The development costs for the 0.13 um, 90 nm and 55 nm production process nodes is several or dozens of times of that for the 0.18 um process node.

2. The NOR-type embedded flash memory is generally integrated into a system chip such as a micro controller chip or a smart card chip. As the flash memory takes up more than 20% of the total chip area, it is very important to control the area of the flash memory. To keep the products competitive, the optimization of the operating conditions for the flash memory is premised on "not adding the area of the circuit". With the development and experience for nearly twenty years, the embedded 2T PMOS flash memory using the optimized operating conditions maintains fully competitive, and ranks top two in the embedded flash memory IP market.

3. The NOR-type embedded 2T PMOS flash memory array has flash memory cells formed of the select gate PMOS transistor and the control gate PMOS transistor. Various functional circuits (such as charge pump circuit, decoding circuit and operational amplifier circuit) are coupled in periphery of the flash memory array. The device characteristics, whether it is the select gate PMOS transistor or the control gate PMOS transistor in the flash memory array or the PMOS transistor or NMOS transistor in the functional circuits, impose limitations on the optimization of the operating condition for the flash memories. For example, the high voltage generated by the charge pump circuit should not be higher than the drain breakdown voltage of the N-type or P-type MOS transistors in a transmission circuit.

4. The quality, especially the reliability, of the flash memories is closely associated with their operating conditions. The optimization of the operating conditions of the flash memories is generally directed to issues that occur during the use of the flash memory products. To address many of these issues, special application conditions (e.g. some specific high temperature or low temperature), longer usage time (e.g. over 10 thousand times of erase-program operations) or a big statistical sample (e.g. over ten millions of chips) are required for detecting, classifying, analyzing and resolving such issues. Thus, the optimization of the corresponding operating conditions is very special and can not be conducted by several experiments or mere theoretical deductions.

After considering the above factors and spending a great amount of research and development investment, we observe that the methods for erasing, reading and programming the flash memory of the present invention has the following benefits:

During the erase operation, the sector selected for the erase operation is properly biased to ensure that the erase condition matches with the device characteristics of the flash memory cells and the high voltage devices, thereby realizing the predetermined erase function and satisfying the requirement on the product performance (especially the erase time). Also, it is ensured that the charge stored within the control gate PMOS transistor of the selected sector can be effectively erased, without any other negative effects. Furthermore, the method of the present invention also properly sets the bias voltages of the sectors not selected for the erase operation, thereby significantly avoiding the negative effects produced by the non-selected sectors, for example, generation of leakage currents.

During the read operation, the flash memory cell selected for the read operation is properly biased to ensure that the read condition matches with the device characteristics of the flash memory cells, thereby a read current of the selected flash memory cell can accurately represent the state of the cell being read. Also, it is ensured that the read circuit is sufficiently simplified to maintain high read speed and low read power consumption. The flash memory cells not selected for the read operation can be properly biased to ensure that the state of the non-selected flash memory cells will not significantly affect the read current of the selected cell during the read operation of the selected flash memory cell. The configuration of the whole read operating condition can avoid the negative effect on the reliability of the flash memory product.

During the program operation, the flash memory cell selected for the program operation is properly biased to ensure that the program condition matches with the device characteristics of the flash memory cell, thereby realizing the predetermined program function. The flash memory cells not selected for the program operation can be properly biased to avoid that the non-selected flash memory cells disturb the selected flash memory cell and are mistakenly programmed. Also, the negative effect of the flash memory cells not selected for the program operation on the reliability of the flash memory product can be avoided.

Further, when performing the erase operation, for the selected flash memory cells, the voltage of the second control line is −10V to −7V, the voltage of the N-type well is 8V to 12V and the voltage of the fourth control line is 7V to 11V, which ensure generation of the FN tunneling effect between the floating gate polysilicon and the N-type well within the control gate PMOS transistor to erase the charge in the floating gate, as well as avoiding the FN tunneling effect between the control gate polysilicon and the floating gate polysilicon within the control gate PMOS transistor to reduce the leakage current between the third control line and the second control line.

Further, when performing the erase operation, in case that the voltage of the N-type well is fixed, the voltages of the first control lines of the non-selected sector and the selected sector are the same. Moreover, the voltages of the third, fourth and first control lines of the non-selected sector are the same. Thus, the negative effects such as the leakage current generated in the non-selected sectors during the erase operation can be avoided.

Further, when performing the read operation, for the non-selected flash memory cell whose third control line is turned on, the voltages of their first and fourth control lines are a voltage of a volt current condenser (VCC), i.e. there is no voltage difference between the first and fourth control lines. Thus, the non-selected flash memory cell will not significantly affect the read current of the flash memory cell selected for the read operation.

Further, when performing the read operation, by applying the VCC voltage to the first and third control lines, the voltage of the fourth control line can be pulled down to 0V and the select gate PMOS transistors of the non-selected flash memory cells can be fully turned off, such that during the read operation on a specific flash memory cell, the negative effect of the non-selected flash memory cells on the read operation of the selected flash memory cell can be avoided.

Further, when performing the program operation, by applying the VCC voltage to the first control lines of the non-selected flash memory cells, the voltages of the first control line and the N-type well are the same as each other and no electron/hole pairs can be generated therebetween, thereby avoiding the possible mistaken programming.

Further, when performing the program operation, by pulling up the voltages of the third control lines of the non-selected flash memory cells to the VCC voltage, the select gate PMOS transistor can be fully turned off. Meanwhile, the negative voltage of the first control line of the flash memory cell selected for the program operation can not be transmitted to the drain of the control gate PMOS transistor, thereby avoiding the possible mistaken programming.

DETAILED DESCRIPTION

The following description provides many technical details to make the present application easier to be understood. However, it should be understood by those of ordinary skill in the art that, the technical solutions as claimed in the present application can be implemented even without these technical details and the various variations and modifications to the embodiments described below.

To make the objectives, technical solutions and advantages of the present invention more clear, the illustrative embodiments of the present application are elaborated below with reference to the accompanying drawings.

In the embodiments of the present invention, to keep the terms in consistence with those commonly used in the art and make the invention more understandable, a first control line is referred to as bit line (BL), a second control line is referred to as word line (WL), a third control line is referred to as select gate line (SG), and a fourth control line is referred to as source line (SL).

Figure 2:
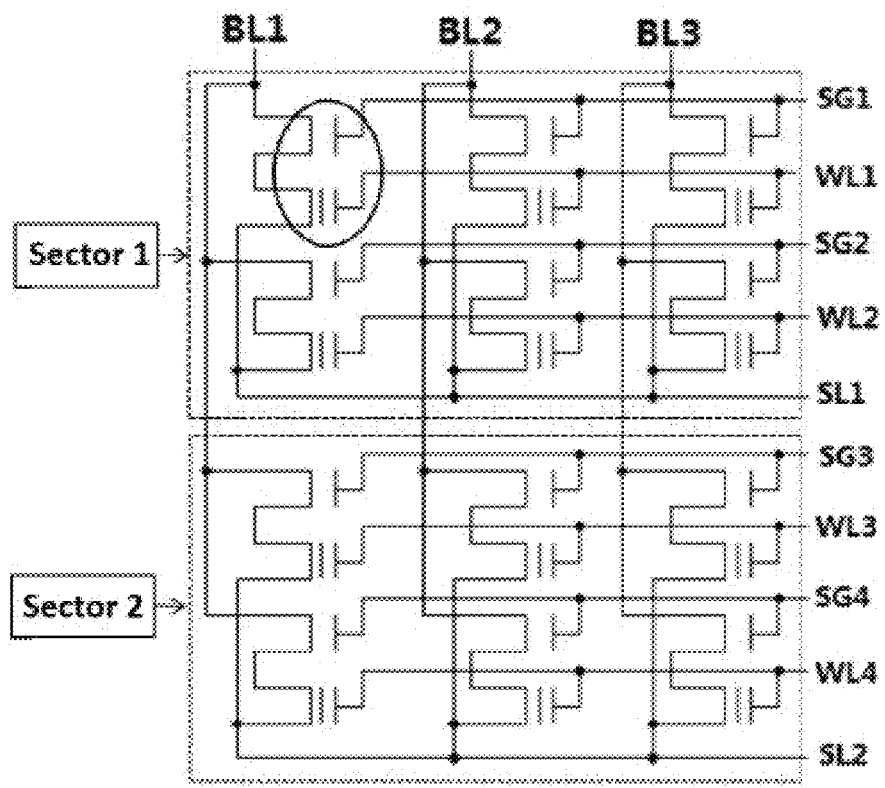
FIG. 2 shows a schematic of a NOR-type embedded flash memory array according to embodiments of the present invention.

A first embodiment of the present invention relates to a method for erasing a flash memory. FIG. 2 shows a schematic of a NOR-type embedded flash memory array. The erase method can be applied to the NOR-type embedded flash memory array.

Specifically, as shown in FIG. 2, the flash memory array includes at least one sector (FIG. 2 only shows the array of two sectors for simplicity), and each sector includes an N-type well and a plurality of flash memory cells coupled in a matrix in the N-type well. Each flash memory cell has a select gate PMOS transistor and a control gate PMOS transistor with a floating gate. A first electrode of the select gate PMOS transistor is coupled to a second electrode of the control gate PMOS transistor.

In the matrix coupled by the flash memory cells, the second electrodes of the select gate PMOS transistors in the same column are coupled together to form a bit line, gates of the select gate PMOS transistors in the same row are coupled together to form a select gate line, gates of the control gate PMOS transistors in the same row are coupled together to form a word line; and the first electrodes of the control gate PMOS transistors of the same sector are coupled together to form a source line.

In each flash memory cell, the select gate PMOS transistor has a gate oxide layer with a thickness of 8 nm to 11 nm, a channel with a length of 100 nm to 300 nm, and a drain breakdown voltage of 8V to 15V. The control gate PMOS transistor has a gate oxide with a thickness of 8 nm to 11 nm, an ONO thin film dielectric layer with a thickness of 10 nm to 20 nm, and a channel with a length of 100 nm to 300 nm. The floating gate of the control gate PMOS transistor has a doping concentration greater than $1\times10^{20}$ cm$^{-3}$ and a thickness of 20 to 100 nm. Moreover, the control gate PMOS transistor has a drain breakdown voltage of 8 to 15 V.

The method for erasing the flash memory includes the following step:

when performing an erase operation, for a sector selected for the erase operation, applying a voltage of 8 to 12 V to its N-type well (deep N-well, DNW), a voltage of 4 to 6 V to its bit lines, a voltage of −10 to −7 V to its word lines, and a voltage of 7 to 11V to its select gate lines and source lines.

The first electrode is a source and the second electrode is a drain, or the first electrode is the drain and the second electrode is the source.

Preferably, in the embodiment, the matrix coupled by the flash memory cells includes at least two sectors. When performing the erase operation, for sectors not selected for the erase operation, a voltage of 8 to 12 V is applied to their DNWs, a voltage of 4 to 6 V is applied to their bit lines, select gate lines and source lines, and the VCC voltage is applied to their word lines.

The bias voltages for the erase operation are configured as follows: WL=−10V~−7V, DNW=8~12V, SL=7V~11V, which can ensure generation of the FN tunneling effect between the floating gate polysilicon and the DNW substrate within the control gate PMOS transistor to erase the charge in the floating gate, as well as avoiding the FN tunneling effect between the control gate polysilicon and the floating gate polysilicon in the control gate PMOS transistor to reduce the leakage current between the select gate line and the word line.

Preferably, the gate oxide layer of the select gate PMOS transistor has a thickness of 10 nm to 11 nm, the channel of the select gate PMOS transistor has a length of 195 nm to 300 nm, and the drain breakdown voltage of the select gate PMOS transistor is 8V to 10V. The control gate PMOS transistor has the gate oxide with a thickness of 10 nm to 11 nm, the ONO thin film dielectric layer with a thickness of 10 nm to 20 nm, and the channel with a length of 165 nm to 260 nm. The floating gate of the control gate PMOS transistor has a doping concentration greater than $3\times10^{20}$ cm$^{-3}$ and a thickness of 20 to 100 nm. Moreover, the drain breakdown voltage of the control gate PMOS transistor is 8 to 10V. When performing the erase operation, a voltage of 9.8V to 10.8V is applied to the N-type well of each sector; for the sector selected for the erase operation, a voltage of 5V is applied to its bit lines, a voltage of −8.8V is applied to its word lines, and a voltage of 9V is applied to its select gate lines and source lines; and for the sectors not selected for the erase operation, a voltage of 5V is applied to its bit lines, select gate lines and source lines, and the VCC is applied to its word lines.

In case that the voltage of the DWN is fixed, the voltages of the bit lines of the non-selected sectors and selected sectors are the same, and the voltages of the select gate lines, source lines and bit lines of the non-selected sector are the same, thereby significantly avoiding the negative effects produced by the non-selected sectors, for example, a generation of leakage currents.

In the embodiment, the volt current condenser VCC is 1.0 to 2.5V.

It should be noted that in the embodiment, when performing the erase operation, the voltage configuration for the bit lines, the DWN and the word lines of the selected sector is required for ensuring that the flash memory can accurately perform the erase function. However, in order to optimize the erase performance of the flash memory, such voltage configuration needs to match with other optimal voltage configurations such as the voltage configuration for the select gate line and source line of the selected sector, and the voltage configuration for the DWN, word lines, bit lines, select gate lines and source lines of the non-selected sectors.

When performing the erase operation, the sector selected for the erase operation is properly biased to ensure that the erase condition matches with the device characteristics of the flash memory cells and the high voltage devices, thereby realizing the predetermined erase function and satisfying the requirement on the product performance (especially the erase time). Also, it is ensured that the charge stored within the control gate PMOS transistor of the selected sector can be effectively erased, without any other negative effects. Furthermore, the method of the present invention also properly sets the bias voltages of the non-selected sectors, thereby significantly avoiding the negative effects produced by the non-selected sectors, for example, generation of leakage currents.

A second embodiment of the present invention relates to a method for erasing a flash memory. FIG. 2 shows the schematic of the NOR-type embedded flash memory array. The erase method can be applied to the NOR-type embedded flash memory array.

Figure 1:
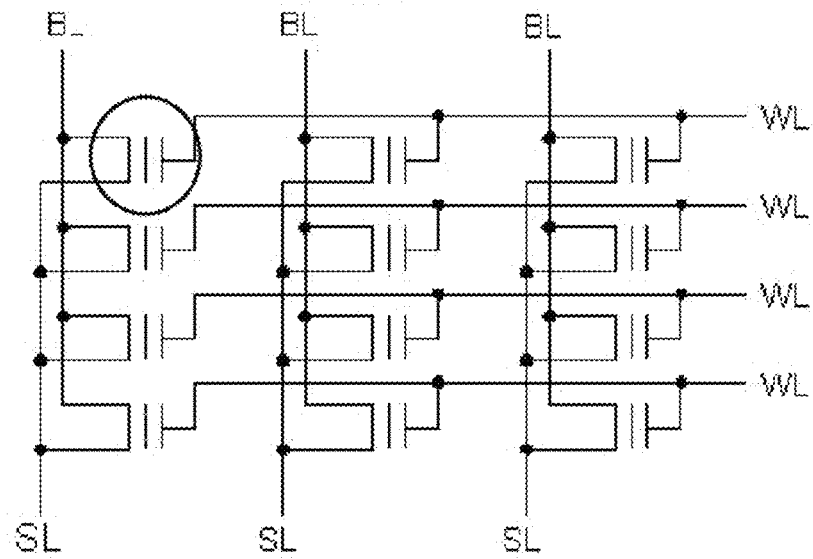
FIG. 1 shows a schematic of a conventional NOR-type embedded flash memory array.

As shown in FIG. 2, the 2T PMOS flash memory includes flash memory cells for storing data, each of which is formed of the select gate PMOS transistor (the select gate line controls its gate voltage) and the control gate PMOS transistor (the word line controls its gate voltage) coupled in series. If it is required to read out data stored in a flash memory cell marked by a circle shown in FIG. 2, the select gate PMOS transistor can be turned on by the select gate line SG1. Furthermore, a proper gate voltage is applied to the control gate PMOS transistor via the word line WL1, such that it can be determined whether the stored data is "0" or "1" by detecting the occurrence of current between the bit line BL1 and the source line SL1 when a voltage difference is applied therebetween. To ensure the data erase speed, the erase operation on the flash memory array is performed in groups each having several word lines. The group having several word lines corresponds to a sector. The source lines SL of each sector are generally coupled together. To simplify the description of the "optimal condition for the erase operation", FIG. 1 only uses two word lines to represent a sector (sector 1 and sector 2). Generally, it is required that, when the erase operation is performed onto some sectors of the flash memory array, data stored in the other sectors should not be affected.

Table 1 provides an optimal erase operating condition for the NOR-type embedded 2T PMOS flash memory. The VLSI circuit manufacturing process mainly uses the P-type silicon substrate. As the embedded flash memory of the embodiment uses the PMOS transistors, the flash memory array should be surrounded by the deep N-type well (DNW), which can be understood as the substrate of the PMOS flash memory devices (with fixed voltage).

TABLE 1

Optimal erase voltage configuration for NOR-type embedded 2T PMOS flash memory

| Sector 1 | BL1/2/3 voltage | SG1/2 voltage | WL1/2 voltage | SL1 voltage | DNW voltage |
|---|---|---|---|---|---|
| (selected) | 4 V~6 V | 7 V~11 V | −10 V~−7 V | 7 V~11 V | 8 V~12 V |
| Sector 2 | BL1/2/3 voltage | SG1/2 voltage | WL1/2 voltage | SL1 voltage | DNW voltage |
| (not selected) | 4 V~6 V | 4 V~6 V | VCC | 4 V~6 V | 8 V~12 V |

Factors needed to be considered when setting and optimizing the erase operating condition includes:

1. The operating condition for the sector selected for the erase operation should match with the device characteristics of the flash memory cells and the high voltage devices, otherwise the erase function can not be realized. For the embedded 2T PMOS flash memory cells using 0.18 um to 55 nm manufacturing process nodes, the flash memory cell devices use the select gate PMOS transistor (without the floating gate) and the control gate PMOS transistor (with the floating gate). The select gate PMOS transistor has the following characteristics: "a gate oxide layer (silicon oxide film) with a thickness of 8 nm to 11 nm, a channel with a length of 100 nm to 300 nm, and a drain breakdown voltage of 8V to 15V". The control gate PMOS transistor has the following characteristics: "a gate oxide with a thickness of 8 nm to 11 nm, an ONO (i.e. silicon oxide-silicon nitride-silicon oxide) thin film dielectric layer with an electric thickness of 10 nm to 20 nm, a channel with a length of 100 nm to 300 nm, a floating gate having a doping concentration greater than $1\times10^{20}$ cm$^{-3}$ and a thickness of 20 to 100 nm, and a drain breakdown voltage of 8 to 15 V". Theoretically, the thickness of the gate oxide layer and the ONO thin film dielectric layer can not be scaled down with the process node, otherwise the data storing performance of the flash memory products would be significantly affected. The above device parameters of the select gate and control gate PMOS transistors place limitation on the bias voltage configuration of the erase operation. For example, during the erase operation, the voltage difference between the drain and source of the select gate PMOS transistor (one node being the BL voltage and the other node being the SL1 voltage) should be moderate and can not cause any punch through, otherwise leakage current may be generated such that the erase function can not be realized. On the other hand, for the embedded 2T PMOS flash memory cells using the 0.18 um to 55 nm manufacturing process nodes, the high voltage MOS devices (HV-MOS) as used have the following main characteristics: "a gate oxide layer with a thickness of 10 nm to 20 nm, a drain breakdown voltage of 10V to 20V". The gate oxide thickness and the drain breakdown voltage of the high voltage MOS device directly place limitation on the maximum voltage transmittable by the circuit.

2. The erase operating condition should effectively erase charges stored within the floating gates of the control gate PMOS transistors in the selected sector, without any other negative effects. Premised on keeping the select gate transistor well turned off, it is mainly required to consider the bias voltages of the nodes of the control gate PMOS transistor for the erase operation. Erasing the charge in the floating gate of the control gate transistor mainly uses the FN tunneling effect between the floating gate polysilicon and the DNW substrate (separated by the gate oxide layer). For the embedded 2T PMOS flash memory of the present invention, the erase operation mainly uses the channel FN tunneling effect to discharge the electrons stored within the floating gate to increase the threshold voltage of the control gate transistor, such that the flash memory cell operated presents data "1" when read by an external circuit. Generally, for the gate oxide films grown using the hot oxidation process, an electric field of 9~10 MV/cm is required for triggering the FN tunneling effect. Thus, in view of the device characteristics of the control gate PMOS transistor (mainly the gate oxide layer thickness and the ONO dielectric layer thickness), the voltage difference between the word line and the source line, and the voltage difference between the word line and the N-well should be greater than 18V. However, an excess voltage difference between the word line and the source line may trigger the FN tunneling effect between the control gate polysilicon (WL) and the floating gate polysilicon, as well as increasing the leakage current between the select gate line and the word line. Thus, after a lot of development work of the practical products, the determined bias voltages for the erase operation are as follows: WL=−10V~−7V, DNW=8~12V, SL=7V~11V. Such bias voltages can ensure that the charge stored in the floating gate of the control gate transistor in the selected sector can be effectively erased, without any other negative effect.

Figure 3A:
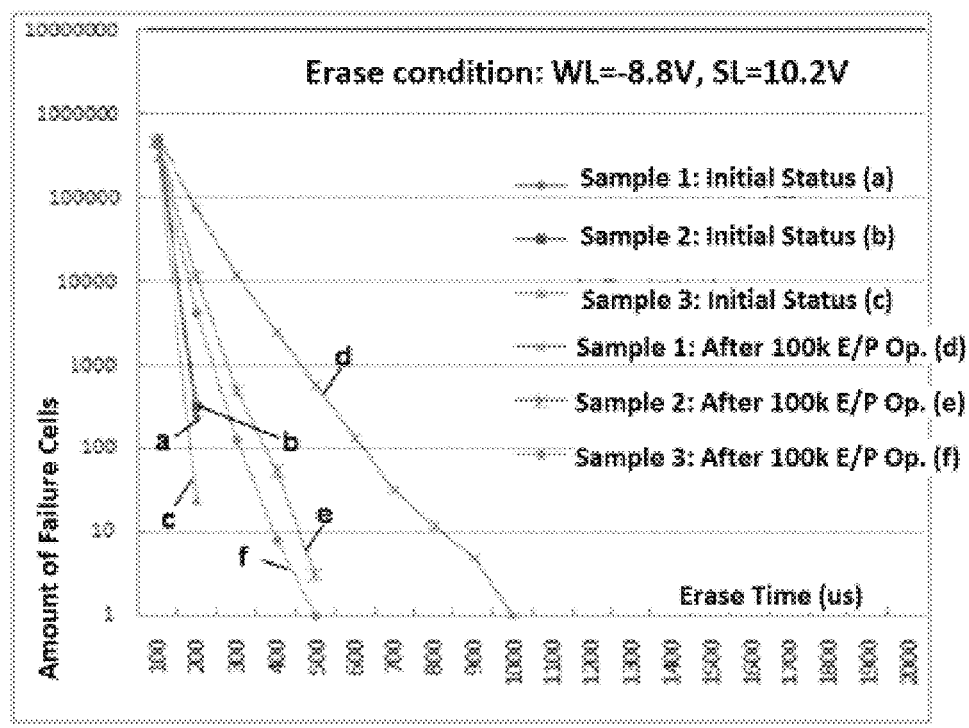
FIG. 3A shows a curve indicating a correlation between the number of failure flash memory cells and the erase time when the source line voltage is fixed according to a second embodiment of the present invention.
Figure 3B:
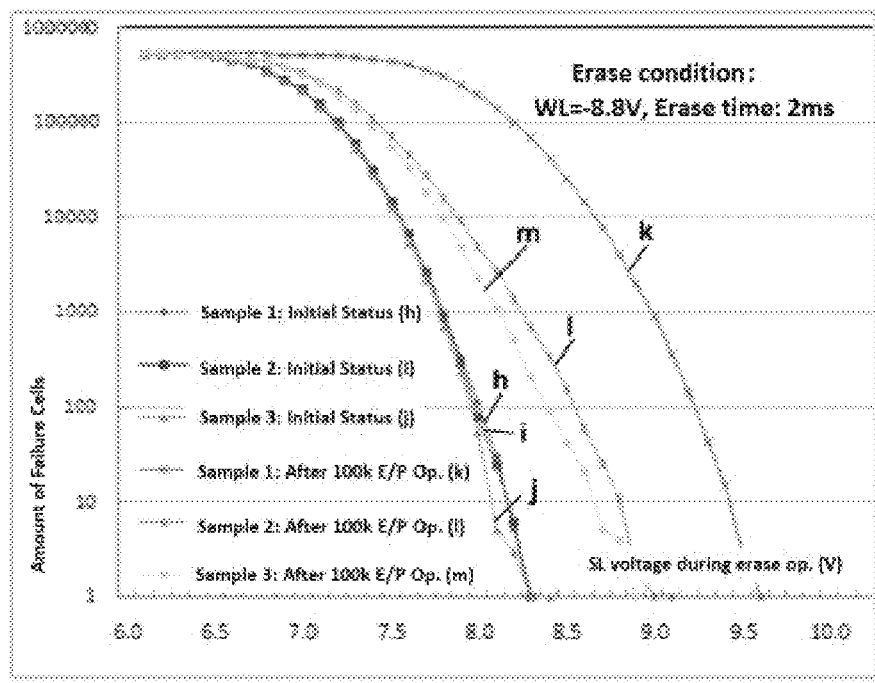
FIG. 3B shows a curve indicating a correlation between the number of failure flash memory cells and the source line voltage when the erase time is fixed according to the second embodiment of the present invention.

3. The erase operating condition should satisfy the requirement on the product performance (mainly the erase time). For the embedded 2T PMOS flash memory, a well-acceptable time required for erasing a single sector is 1~2 ms. Generally, when the sector is erased, the bigger the voltage difference between the gate and the drain (WL/SL) of the control gate PMOS transistor is, the more obvious the FN tunneling effect is and the faster the erase operation is. FIG. 3A shows a curve indicating a correlation between the number of failure flash memory cells and the erase time for a flash memory product sample when the source line voltage is fixed. FIG. 3B shows a curve indicating a correlation between the number of failure flash memory cells and the source line voltage for the flash memory product sample when the erase time is fixed. As can be seen from FIG. 3A, initially, the flash memory chip can be erased clean within 0.3 ms under a condition that SL=10.2V and WL=−8.8V (as shown in curves a, b and c in FIG. 3A).

However, it may require 0.5~1 ms to erase the chip clean (as shown in curves d, e and f in FIG. 3A) when the chip is degraded after 100 thousand times of erase-program operations. The embedded flash memory should satisfy the requirement of 100 thousand times of erase-program operations, thus the SL voltage during the erase operation has a minimum requirement. FIG. 3B shows the correlation between the number of failure cells and the SL voltage in case that the erase time is 2 ms and the voltage of the word line is −8.8V. Similarly, the flash memory chip initially can be erased clean under a condition that SL=8.3V (as shown in curves h, i and j in FIG. 3B). However, when the chip is degraded after 100 thousand times of erase-program operations, the chip can be erased under a condition that the SL voltage is greater than 9.0V or 9.6V (as shown in curves k, l and m in FIG. 3B). With reference to the statistical data of the practical product development, the determined SL voltage for the erase operation is not less than 7V. However, the excess SL voltage may cause other problems (such as "erase disturb"), thus optimization and tradeoff is required to achieve the fastest erase speed premised on satisfying the time and quality requirement of the product (see section 4 below).

Figures 4, 5A:
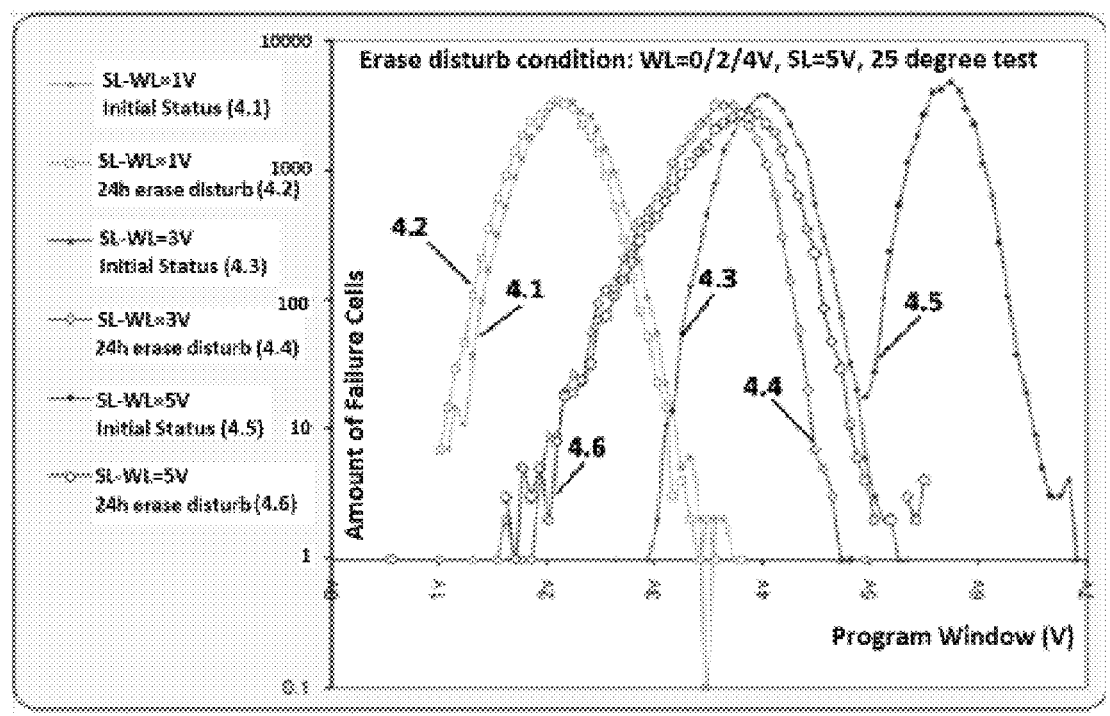
FIG. 4 shows a curve indicating a correlation between the number of failure cells and the program window voltage under different WL/SL voltage differences according to the second embodiment of the present invention.
FIG. 5A shows a curve indicating a correlation between the number of failure cells and the program window voltage in case of a 2-hour erase time according to the second embodiment of the present invention.

4. The operating condition for the non-selected sectors should avoid the negative effect, which mainly relates to "leakage" and "reliability". For the select gate PMOS transistors, the voltage of the DNW substrate is determined (the voltages of the DNW substrates of all the flash memory arrays are the same), thus, the voltages of the bit lines and the select gate lines determine the electric stress born by select gate PMOS transistors. In order to ensure that the select gate transistors are well turned off and the possible gate induced drain leakage (GIDL effect) is inhibited, the best choice is to set the voltages of the corresponding bit lines and select gate lines of the select gate PMOS transistors in the non-selected sectors the same as each other, which is assumed as X. First, the voltage difference between X and SL should be as small as possible, otherwise leakage may be generated between the source line and the bit line, thus the best choice is to set the SL voltage as X. Moreover, as the voltage of the word line is VCC, the voltage difference between X and VCC should be as small as possible, otherwise similar FN tunneling effect (i.e. "erase disturb") may be generated between the word line and the source line. FIG. 4 shows that the number of failure cells varies with the program window voltage under different SL/WL voltage differences, when the ambient temperature is 25 degrees centigrade. As can be seen from FIG. 4, when the WL/SL voltage difference is 1V, the erase disturb slightly affects the program window (as shown by curve 4.1 and 4.2 in FIG. 4). However, when the WL/SL voltage difference is greater than 3V, the erase disturb may significantly degrade the program window (the situation for the 5V voltage difference is more obvious than that for the 3V voltage difference, which is shown by curves 4.3 to 4.6 in FIG. 4).

Figure 5B:
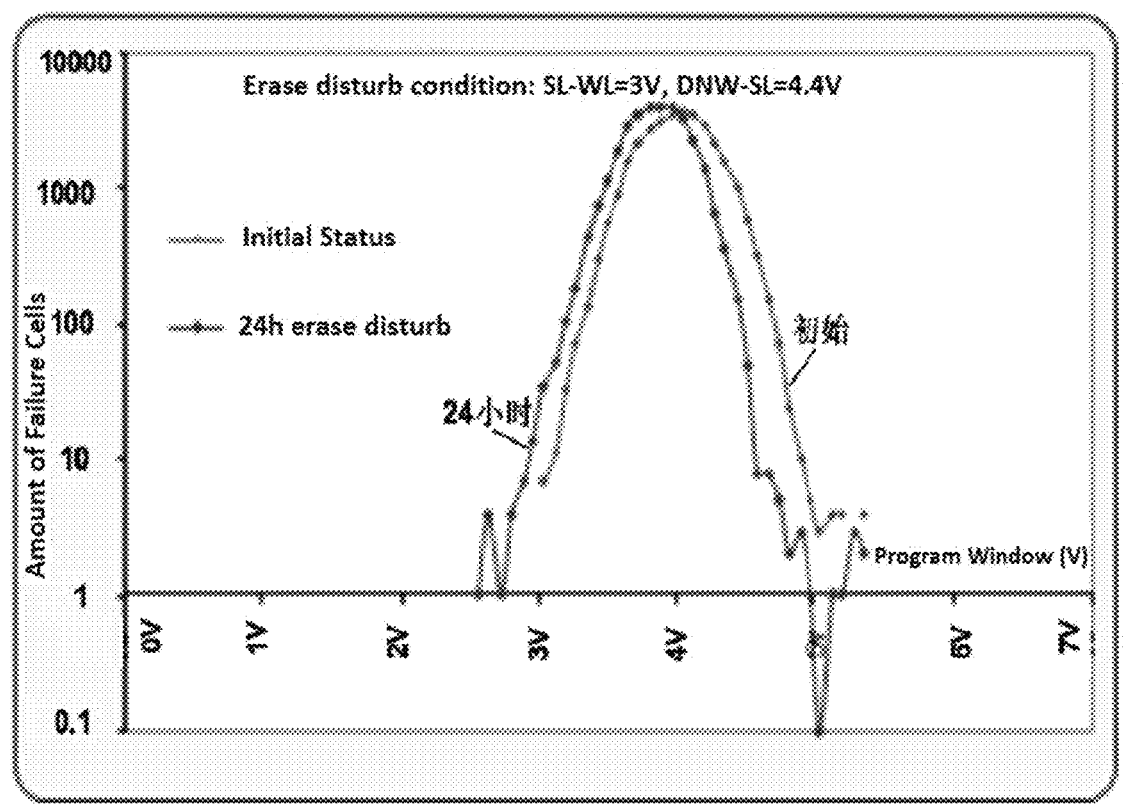
FIG. 5B shows a curve indicating a correlation between the number of failure cells and the program window voltage in case of a 24-hour erase time according to the second embodiment of the present invention.

On the other hand, the voltage difference between BL and DNW, and the electric stress born by the select gate PMOS transistor and the control gate PMOS transistor both positively depend on X. Thus, the bigger X is, the more reliable the product is (capable of bearing more times of erase/program operations). As shown by the data in FIGS. 5A and 5B, when the DNW/SL voltage difference is 4.4V, the 24-hour continuous erase disturb does not significantly affect the program window (as shown in FIG. 5B). However, when the DNW/SL voltage difference is 6.4V, the 2-hour continuous erase disturb significantly reduces the program window (as shown in FIG. 5A).

In view of the above factors, the determined bias voltage configuration for the non-selected sectors is as follows: BL=SG=SL, which range from 4V to 6V.

A third embodiment of the present invention relates to a method for reading a flash memory. FIG. 2 shows the schematic of the NOR-type embedded flash memory array. The read method can be applied to the NOR-type embedded flash memory array.

Specifically, as shown in FIG. 2, the flash memory array fit for using the read method includes at least one sector, and each sector includes an N-type well and a plurality of flash memory cells coupled in a matrix in the N-type well. Each flash memory cell has a select gate PMOS transistor and a control gate PMOS transistor with a floating gate. A first electrode of the select gate PMOS transistor is coupled to a second electrode of the control gate PMOS transistor.

In the matrix coupled by the flash memory cells, the second electrodes of the select gate PMOS transistors in the same column are coupled together to form a bit line, gates of the select gate PMOS transistors in the same row are coupled together to form a select gate line, gates of the control gate PMOS transistors in the same row are coupled together to form a word line; and the first electrodes of the control gate PMOS transistors of each sector are coupled together to form a source line.

In each flash memory cell, the select gate PMOS transistor has a gate oxide layer with a thickness of 8 nm to 11 nm, a channel with a length of 100 nm to 300 nm, and a drain breakdown voltage of 8V to 15V. The control gate PMOS transistor has a gate oxide with a thickness of 8 nm to 11 nm, an ONO thin film dielectric layer with a thickness of 10 nm to 20 nm, and a channel with a length of 100 nm to 300 nm. The floating gate of the control gate PMOS transistor has a doping concentration greater than $1 \times 10^{20}$ cm$^{-3}$ and a thickness of 20 to 100 nm. Moreover, the control gate PMOS transistor has a drain breakdown voltage of 8 to 15V.

The method for reading the flash memory includes the following step:

When performing a read operation, applying the VCC voltage to the N-type well of each sector; for the flash memory cells selected for the read operation, applying the VCC voltage to their bit lines, a voltage of 0V to their source lines and bit lines, and a voltage of −2.0V to −0.5V to their select gate lines.

In the embodiment, the method for reading the flash memory further includes the following step:

When performing the read operation, for flash memory cells not selected for the read operation, applying a voltage of 0V to their bit lines, source lines and word lines, and a voltage of −2.0V to −0.5V to their select gate lines. The non-selected flash memory cells and the selected flash memory cells have the same select gate line and different bit lines.

The select gates of the non-selected flash memory cells are turned off and their source lines and bit lines are set as 0V, i.e. there is no voltage difference between the bit lines and source lines, thereby the non-selected flash memory cells will not affect read currents of the selected flash memory cells.

In the embodiment, the method for reading the flash memory further includes the following step:

When performing the read operation, for the non-selected flash memory cells, applying the VCC voltage to their bit lines and select gate lines, and a voltage of 0V to their word lines and source lines. The non-selected flash memory cells and the selected flash memory cells have the same bit line and different select gate lines.

By setting that SG=BL=VCC, the select gate PMOS transistors in the non-selected flash memory cells whose source lines are pulled down to 0V can be fully turned off such that, when the read operation is performed on certain flash memory cell, it can be avoided that the other non-selected flash memory cells significantly affect the selected flash memory cell.

In the embodiment, the method for reading the flash memory further includes the following step:

When performing the read operation, for the non-selected flash memory cells, the VCC voltage is applied to their select gate lines, and a voltage of 0V is applied to their bit lines, source lines and word lines. The non-selected flash memory cells and the selected memory cells have different bit lines and different select gate lines.

The first electrode is a source and the second electrode is a drain, or the first electrode is the drain and the second electrode is the source.

Preferably, the gate oxide layer of the select gate PMOS transistor has a thickness of 10 nm to 11 nm, the channel of the select gate PMOS transistor has a length of 195 nm to 300 nm, and the drain breakdown voltage of the select gate PMOS transistor is 8V to 10V. The control gate PMOS transistor has the gate oxide with a thickness of 10 nm to 11 nm, the ONO thin film dielectric layer with a thickness of 10 nm to 20 nm, and the channel with a length of 165 nm to 260 nm. The floating gate of the control gate PMOS transistor has a doping concentration greater than $3 \times 10^{20}$ cm$^{-3}$ and a thickness of 20 to 100 nm. Moreover, the drain breakdown voltage of the control gate PMOS transistor is 8 to 10 V. When performing the read operation, the VCC voltage is applied to the N-type well of each sector; for the sector selected for the read operation, the VCC voltage is applied to its bit line, a voltage of 0V is applied to its word line, and a voltage of −1.5∼−1V is applied to its select gate line, and a voltage of 0V is applied to its source line; and for the sectors not selected for the read operation, a voltage of 0V is applied to its bit line, word line and source line, and a voltage of −1.5V∼−1V is applied to its select gate line. The non-selected flash memory cells and the selected flash memory cell have the same select gate line and different bit lines.

In the embodiment, the VCC voltage is 1.0 to 2.5V.

It should be noted that in the embodiment, when performing the read operation, the voltage configuration for the bit line and the source line of the selected flash memory cell is required for ensuring that the flash memory can accurately perform the read function. However, in order to optimize the read performance of the flash memory, such voltage configuration needs to match with other optimal voltage configurations such as the voltage configuration for the select gate line and word line of the selected flash memory cell, the voltage configuration for the DWN of each sector, and the voltage configuration for the word lines, bit lines, select gate lines and source lines of the non-selected flash memory cells.

When the read operation is performed, the sector selected for the read operation is properly biased to ensure that the read condition matches with the device characteristics of the flash memory cells such as the channel length and the gate oxide layer thickness, thereby the read currents of the selected flash memory cells can accurately represent the state of the read cell. Moreover, it is ensured that the read circuit has a faster read speed and a lower read power consumption. Furthermore, after several times of erase/program operations, the damage to the tunneling oxide layer between the substrate and the floating gate of the control gate PMOS transistor can be reduced, thereby avoiding the negative effect on the reliability of the flash memory product caused by the read operation. The bias voltage configuration for the non-selected flash memory cells can ensure that, when performing the read operation on certain flash memory cell, the state of the other non-selected flash memory cells will not significantly affect the read current of the selected flash memory cell.

A fourth embodiment of the present invention relates to a method for reading a flash memory. FIG. 2 shows the schematic of the NOR-type embedded 2T PMOS flash memory array. The read method can be applied to the NOR-type embedded flash memory array.

In the embodiment, when certain flash memory cell of the NOR-type embedded 2T PMOS flash memory is read, the state of the flash memory cell is determined by comparing a read current with a reference current. Generally, if the read current of the selected flash memory cell is greater than the reference current, it is determined that the flash memory cell stores "0"; otherwise the flash memory cell stores "1". Table 2 provides an optimal read operating condition for the NOR-type embedded 2T PMOS flash memory.

TABLE 2

| Optimal read voltage configuration for NOR-type embedded 2T PMOS flash memory | | | | | |
|---|---|---|---|---|---|
| Circle-marked cell (selected) | BL1 vol. VCC | SG1 vol. −2.0∼−0.5 V | WL1 vol. 0 V | SL1 vol. 0 V | DNW vol. VCC |
| Same SG different BL (not selected) | BL2/3 vol. 0 V | SG1 vol. −2.0∼−0.5 V | WL1 vol. 0 V | SL1 vol. 0 V | DNW vol. VCC |
| Same BL different SG (not selected) | BL1 vol. VCC | SG2/3/4 vol. VCC | WL2/3/4 vol. 0 V | SL1/2 vol. 0 V | DNW vol. VCC |
| Different SG and BL (not selected) | BL2/3 vol. 0 V | SG2/3/4 vol. VCC | WL2/3/4 vol. 0 V | SL1/2 vol. 0 V | DNW vol. VCC |

Factors needed to be considered when setting and optimizing the read operating condition includes:

1. The read condition should match with the device characteristics of the flash memory cell device, such that the read current of the selected cell can accurately represent its state. The main characteristics needed to be considered includes "the threshold voltage of the select gate PMOS transistor" and "the threshold voltage of the control gate PMOS transistor" under the bias voltage condition that DNW=VCC. The purpose is to "make the read current of the flash memory cell under the program state big enough, and make the read current of the flash memory cell under the erase state as small as possible". In view of the above considerations, the SG voltage of the selected cell (the circle-marked flash memory cell in FIG. 2) should be as low as possible. However, it should be noted that a special circuit is required for generating a negative voltage and an excess low SG voltage is unfavorable from the perspective of the circuit area, read speed and power consumption, thus there is tradeoff between the two aspects. The WL voltage of the selected cell should be moderate. Thus, it can be ensured that, under the premise that the control gate transistor can not be turned on in the erase state and sufficiently turned on in the program state, the read current difference between the program state and the erase state can be as big as possible and the read current symmetrically distributes about the reference current (assuming that the performance degradation caused by the erase operation is the same as that caused by the program operation). The determined bias voltages for the optimal read operation for the selected cell is as follows: SG=−2.0~−0.5V, WL=SL=0V, DNW=BL. However, the values of the bias voltages are limited to the read speed and the reliability.

2. The read condition requires that the read circuit should be as simple as possible, the read speed should be as fast as possible, and the read power consumption should be as low as possible. During the read operation, the current of the selected cell mainly depends on the BL/SL voltage difference when the SL/WL voltage is fixed. Thus, the BL/SL voltage difference should be as big as possible from the perspective of the read current. However, in consideration of the charge/discharge speed of the read circuit and the device characteristics of the flash memory cell, the determined BL voltage is equal to the VCC voltage. A voltage higher than the VCC voltage requires a pump/boost circuit, which may affect the simplicity and read speed of the circuit. A voltage lower than the VCC voltage can not provide a read current sufficient to distinguish "0" and "1" (especially after degradation of performance of the flash memory due to 100 to 200 thousand times of erase-program operations). In the case that the BL/SL voltage difference is fixed at the VCC voltage, the condition that BL=0V, SL=VCC is better than the condition that BL=VCC, SL=0V from the perspective of the read circuit area because the BL voltage of the former condition requires a high-voltage NMOS transistor (HVNMOS) to transmit the low voltage and the BL voltage of the latter condition requires a high-voltage PMOS transistor (HVPMOS) to transmit the high voltage. The current of the NMOS transistor is bigger than that of the PMOS transistor if the transistor areas thereof are the same. However, it is determined that BL=VCC and SL=0V, which is mainly limited to the "reliability" (see section 4 of this embodiment).

3. The non-selected cells should not significantly affect the read current of the selected cell. The main considerations include that: (1) there is no voltage difference and current between the BL and SL of the non-selected flash memory cells whose SG is turned on (by setting SL=BL=0V); (2) the select gate PMOS transistor of the non-selected flash memory cell whose SL is pulled down to 0 is sufficiently turned off, thereby having no current (by setting SG=BL=VCC). Under such bias configuration, when certain flash memory cell is read, the state of the non-selected flash memory cells can not affect the read current of the selected flash memory cell.

Figure 6A:
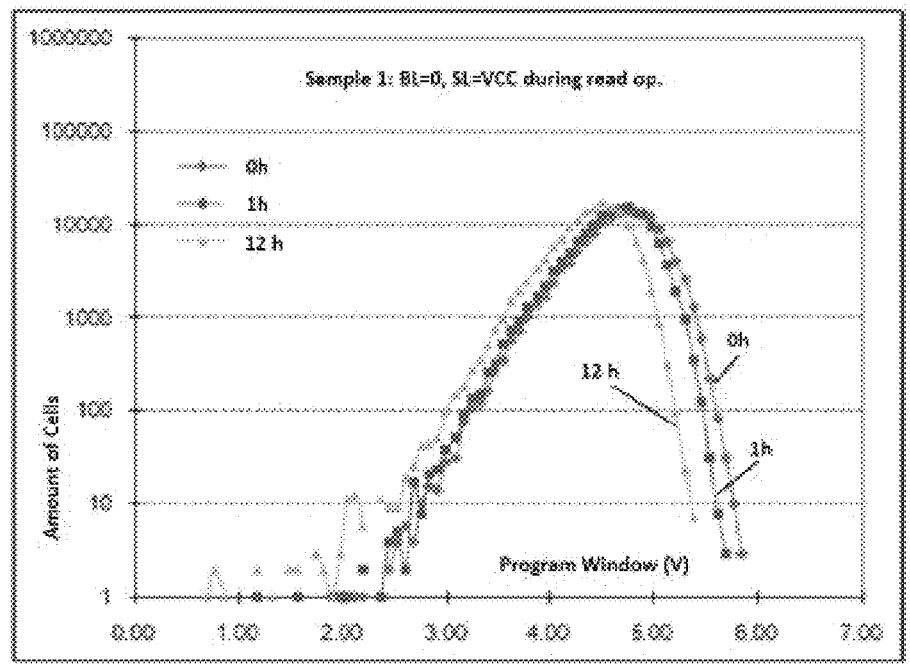
FIG. 6A shows a LTDR test result under different test times in case of a BL voltage of 0V and a SL voltage of VCC according to a fourth embodiment of the present invention.
Figure 6B:
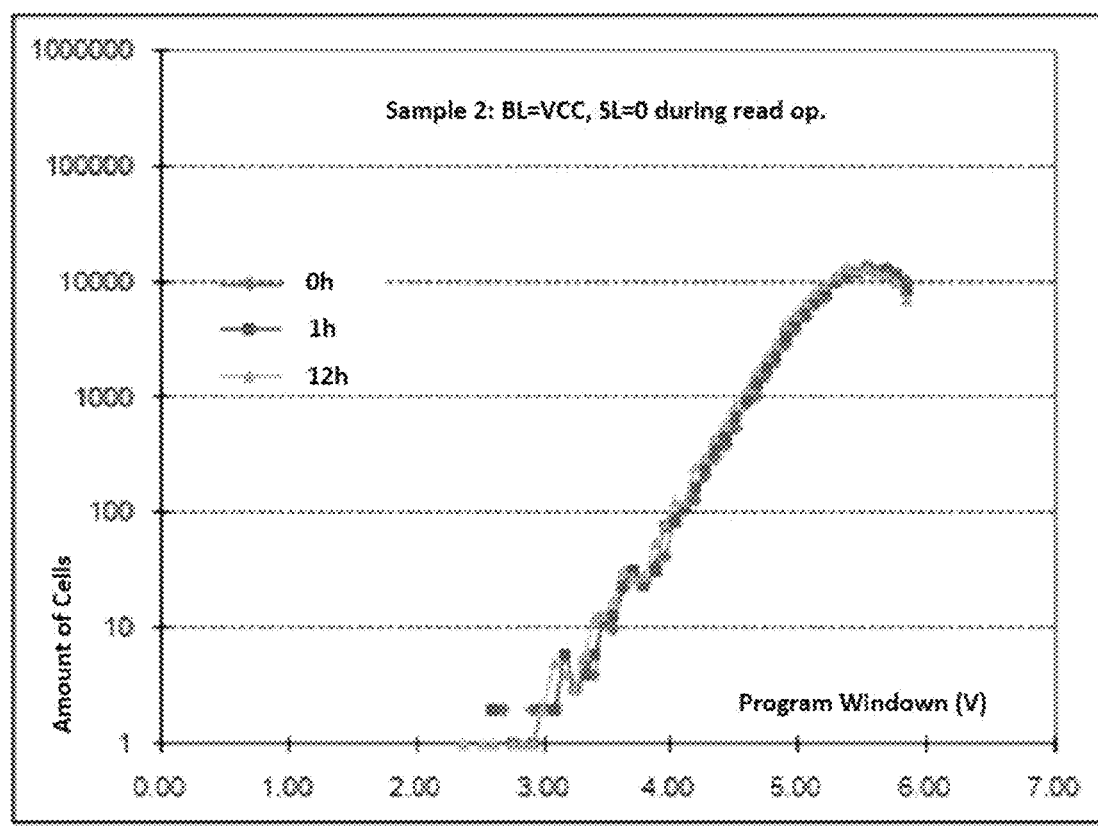
FIG. 6B shows a LTDR test result under different test times in case of a BL voltage of VCC and a SL voltage of 0V according to the fourth embodiment of the present invention.

4. The whole read operating condition should not adversely affect the reliability of the flash memory product. For the embedded flash memory products, an important reliability test associated with the read operation in the provisions of Joint Electron Device Engineering Council (JEDEC) is the non-volatile memory low-temperature retention and read disturb (LTDR, JESD22-A108) test. The particular condition for the test reads as follows: "performing the erase/program operation cycle for 1000 times on 77 flash memory sample under room temperature 25 degree-C., then pre-setting all the flash memory cells as the "Check Board Pattern" (data "1" is surrounded with data "0' and data "0" is surrounded with data "1") and performing continuous read operations thereon, wherein the temperature during the read operation is 85 degree-C. or above (which is generally the highest work temperature for the technical specification of the embedded flash memory product), the operation voltage is greater than 1.1 times the VCC voltage, the read time is generally 1000 hours, and the sample should not fail. According to the data of the real tests shown in FIGS. 6A and 6B, the performance degradation caused by the condition that BL=0, SL=VCC is more obvious than that caused by the condition that BL=VCC, SL=0. The value of the program window denotes a voltage applied to the WL voltage that is required for converting "0" into "1" in the program state (WL=0V during a normal operation), which usually represents the strength of the program operation. The lateral axis in FIGS. 6A and 6B represents the program window, the vertical axis represents the number of the flash memory cells, and the whole curve represents the distribution of the strength of program operations for the flash memory cells in a single flash memory chip sample (similar to the norm distribution). As shown in FIG. 6A, the continuous read operation for mere 12 hours causes the distribution moving to the left, and several outlying abnormal flash memory cells exist (the read operation on the entire sample is determined as failure is only one cell move to equal to or less than 0). As shown in FIG. 6B, the continuous read operation for 12 hours does not affect the distribution. From the physical perspective, the tunneling oxide layer between the floating gate and the substrate of the control gate transistor is avoidably damaged after the 1000 cycles of erase/program operations because the essence of the erase/program operation is a process that the electrons enter into the floating gate through the tunneling oxide layer. Various types of traps of different polarities and at different positions exist in the tunneling oxide layer. These traps can be regarded as certain type of defect, which generally affects only one of the electron or hole due to the characteristics difference. These traps randomly exist and may not affect the electrons stored within the floating gate easily when there are few traps. During the LTDR process, however, there is an electric field with a definite direction between the floating gate and the SL because WL is equal to 0 if the read condition is configured as BL=0, SL=VCC. The directing of electric field combined with the existence of the traps produced by the 1000 cycles of erase/program operations makes it easier that the electrons stored in the floating gate flee out. Thus, it can be seen that the statistical program window moves to the left (weaken) in case of a big number of flash memory cells. Moreover, some flash memory cells turn into the outlying "abnormal cells" due to the difference in the thickness, quality or other features of the tunneling oxide layer. In view of the above considerations and data, the determined read condition is as follows: BL=VCC, SL=WL=0V.

A fifth embodiment of the present invention relates to a method for programming a flash memory. FIG. 2 shows the schematic of the NOR-type embedded flash memory array. The program method can be applied to the NOR-type embedded flash memory array.

Specifically, as shown in FIG. 2, the flash memory array includes at least one sector, and each sector includes an N-type well and a plurality of flash memory cells coupled in a matrix in the N-type well.

Each flash memory cell has a select gate PMOS transistor and a control gate PMOS transistor with a floating gate. A first electrode of the select gate PMOS transistor is coupled to a second electrode of the control gate PMOS transistor.

In the matrix coupled by the flash memory cells, the second electrodes of the select gate PMOS transistors in the same column are coupled together to form a bit line, gates of the select gate PMOS transistors in the same row are coupled together to form a select gate line, gates of the control gate PMOS transistors in the same row are coupled together to form a word line; and the first electrodes of the control gate PMOS transistors of each sector are coupled together to form a source line.

In each flash memory cell, the select gate PMOS transistor has a gate oxide layer with a thickness of 8 nm to 11 nm, a channel with a length of 100 nm to 300 nm, and a drain breakdown voltage of 8V to 15V. The control gate PMOS transistor has a gate oxide with a thickness of 8 nm to 11 nm, an ONO thin film dielectric layer with a thickness of 10 nm to 20 nm, and a channel with a length of 100 nm to 300 nm. The floating gate of the control gate PMOS transistor has a doping concentration greater than $1\times10^{20}$ cm$^{-3}$ and a thickness of 20 to 100 nm. Moreover, the control gate PMOS transistor has a drain breakdown voltage of 8 to 15 V.

The method for programming the flash memory includes the following step:

When performing a program operation on the flash memory, applying the VCC voltage to the N-type well; for a flash memory cell selected for the program operation, applying a voltage of VCC−6.5V to VCC−4.5V to its bit line, a voltage of VCC+6V to VCC+9V to its word line, a voltage of VCC−8.5V to VCC−6.5V to its select gate line, and a voltage of VCC−1V to VCC−0.5V to its source line.

In the embodiment, the method for programming the flash memory further includes the following step:

When performing the program operation, for the flash memory cells not selected for the program operation, applying the VCC voltage to their bit lines, a voltage of VCC−8.5V to VCC−6.5V to their selected gate lines, a voltage of VCC+6V to VCC+9V to their word lines, and a voltage of VCC−1V to VCC−0.5V to their source lines. The flash memory cells not selected for the program operation and the selected flash memory cell are in the same sector, and have the same select gate line and different bit lines.

The voltage at the BL is the same as that of the DNW by pulling the voltages of the BL of the non-selected flash memory cells to the VCC voltage such that no electron/hole pair can be generated between the BL and the DNW, thereby avoiding the possible "mistaken programming".

In the embodiment, the method for programming the flash memory further includes the following step:

When performing the program operation, for the non-selected flash memory cells, applying a voltage of VCC−6.5V to VCC−4.5V to their bit lines, the VCC voltage to their select gate lines, a voltage of VCC+6V to VCC+9V to their word lines, a voltage of VCC−1V to VCC−0.5V to their source lines. The non-selected flash memory cells and the selected flash memory cells are in the same sector, and have the same bit line and different select gate lines.

The select gate PMOS transistors can be fully turned on by pulling the voltage of the SG of the non-selected flash memory cells to the VCC voltage. Then the negative voltage of the BL of the selected flash memory cell can not be transmitted to the drain of the control gate PMOS transistor, thereby avoiding the possible "mistaken programming".

In the embodiment, the method for programming the flash memory further includes the following step:

When performing the program operation, for the non-selected flash memory cells, applying the VCC voltage to their bit lines and select gate lines, a voltage of VCC+6V to VCC+9V to their word lines and a voltage of VCC−1V to VCC−0.5V to their source lines. The non-selected flash memory cells and the selected flash memory cells are in the same sector, and have different select gate lines and different bit lines.

By pulling the BL voltage of the flash memory cells down to equal to their DNW voltage, no electron/hole pair can be generated between the BL and the DNW. Furthermore, the SG voltage can be pull up to the VCC voltage such that the negative voltage of the BL of the selected flash memory cell can not be transmitted to the drain of the control gate PMOS transistors, thereby avoiding the possible "mistaken programming".

Preferably, in the embodiment, the matrix coupled by the flash memory cells include at least two sectors, the above program method further includes the following steps:

When performing the program operation, for the non-selected flash memory cells, applying a voltage of VCC−6.5V to VCC−4.5V to their bit lines, the VCC voltage to their select gate lines, a voltage of VCC−1V to VCC−0.5V to their word lines and source lines. The non-selected flash memory cells and the selected flash memory cells are in different sectors, and have the same bit line and different select gate lines.

When performing the program operation, for the non-selected flash memory cells, applying the VCC voltage to their bit lines and select gate lines, a voltage of VCC−1V to VCC−0.5V to their source lines and word lines. The non-selected flash memory cells and the selected flash memory cell are in different sectors, and have different bit lines and different select gate lines.

In the embodiment, the VCC voltage ranges from 1.0V to 2.5V.

The first electrode is the source and the second electrode is the drain, or the first electrode is the drain and the second electrode is the source.

Preferably, in the embodiment, the matrix coupled by the flash memory cells includes at least two sectors, the gate oxide layer of the select gate PMOS transistor has a thickness of 10 nm to 11 nm, the channel of the select gate PMOS transistor has a length of 195 nm to 300 nm, and the drain breakdown voltage of the select gate PMOS transistor is 8V to 10V. The control gate PMOS transistor has the gate oxide with a thickness of 10 nm to 11 nm, the ONO thin film dielectric layer with a thickness of 10 nm to 20 nm, and the channel with a length of 165 nm to 260 nm. The floating gate of the control gate PMOS transistor has a doping concentration greater than $3\times10^{20}$ cm$^{-3}$ and a thickness of 20 to 100 nm. Moreover, the drain breakdown voltage of the control gate PMOS transistor is 8 to 10 V. When performing the program operation, the selected flash memory cell is configured that its bit line voltage is 6.1V lower than the VCC voltage, its word line voltage is 8.8V higher than the VCC voltage, its select gate line voltage is 8.1V lower than the VCC voltage, and its source line voltage is 0.8V lower than the VCC voltage; the non-selected flash memory cells are configured that their bit line voltage is VCC, their word line voltage is 8.8V higher than the VCC voltage, their select gate voltage is 8.1V lower than the VCC voltage, their source line voltage 0.8V lower than the VCC voltage; wherein the non-selected flash memory cells and the selected flash memory cell are in the same sector, and have the same select gate line and different bit lines. Further, the non-selected flash memory cells are configured that their bit line voltage is 6.1V lower than the VCC voltage, their word line voltage is 8.8V higher than the VCC voltage, their select gate line voltage is VCC and their source line voltage is 0.8V lower than the VCC voltage; wherein the non-selected flash memory cells and the selected flash memory cell are in the same sector and have the same bit line and different select gate lines. Further, the non-selected flash memory cells are configured that their bit line voltage and their select gate voltage are VCC, their word line voltage is 8.8V higher than the VCC voltage, their source line voltage are 0.8V lower than the VCC voltage; wherein the non-selected flash memory cells and the selected flash memory cell are in the same sector and have different bit lines and different select gate lines. Further, the non-selected flash memory cells are configured that their bit line voltage is 6.1V lower than the VCC voltage, their select gate voltage is VCC, their bit line voltage and their source line voltage are 0.8V lower than the VCC voltage; wherein the non-selected flash memory cells and the selected flash memory cell are in different sectors and have the same bit line and different select gate lines. Further, the non-selected flash memory cells are configured that their bit line voltage and select gate voltage are VCC, their bit line voltage and source line voltage are 0.8V lower than the VCC voltage; wherein the non-selected flash memory cells and the selected flash memory cell are in different sectors and have different first control lines and different third control lines.

It should be noted that, in the embodiment, when the program operation is performed, the voltage configuration of the BL and WL of the selected flash memory cell is required for ensuring the flash memory cell to realize the program function accurately. However, to ensure optimizing the program performance of the flash memory cell, the voltage configuration of the BL and WL of the selected flash memory cell should match with other preferable voltage data, for example, the voltage configuration of the SG and SL of the selected flash memory cell, the voltage configuration of the DNW of each sector and the voltage configuration of the WL, BL, SG and SL of the non-selected flash memory cells.

When the program operation is performed, the program operating condition for the selected flash memory cell is properly configured to ensure that the program operating condition matches with the device characteristics of the flash memory device to realize the predetermined program function. The non-selected flash memory cells are properly biased to avoid disturbing the selected flash memory cell, and possible "mistaken programming" of the non-selected flash memory cells. Furthermore, it can be avoided that the non-selected flash memory cells adversely affect the reliability of the flash memory product.

A sixth embodiment of the invention relates to a method for programming a flash memory. FIG. 2 shows the schematic of the NOR-type embedded 2T PMOS flash memory array. The program method can be applied to the NOR-type embedded flash memory array.

The program operation generally uses the band-band hot electron injection (BBHE) effect to inject electrons into a floating gate of the NOR-type embedded 2T PMOS flash memory of the embodiment to lower the threshold of its control gate transistor. Then a read current is bigger than a reference current when the flash memory cell is read, which is defined as data "0" by an external circuit. Table 3 provides an optimal program operating condition for the NOR-type embedded 2T PMOS flash memory.

TABLE 3

Optimal program voltage configuration for NOR-type embedded 2T PMOS flash memory

| | | | | | |
|---|---|---|---|---|---|
| Circle marked cell (selected) | BL1 vol. VCC−6.5 V~VCC−4.5 V | SG1 vol. VCC−8.5 V~VCC−6.5 V | WL1 vol. VCC+6 V~VCC+9 V | SL1 vol. VCC−1.0 V~VCC−0.5 V | DNW vol. VCC |
| Same sector, same SG, different BL (not selected) | BL2/3 vol. VCC | SG1 vol. VCC−8.5 V~VCC−6.5 V | WL1 vol. VCC+6 V~VCC+9 V | SL1 vol. VCC−1.0 V~VCC−0.5 V | DNW vol. VCC |
| Same sector, same BL, different SG (not selected) | BL1 vol. VCC−6.5 V~VCC−4.5 V | SG2 vol. VCC | WL2 vol. VCC+6 V~VCC+9 V | SL1 vol. VCC−1.0 V~VCC−0.5 V | DNW vol. VCC |
| Same sector, different SG and different BL (not selected) | BL2/3 vol. VCC | SG2 vol. VCC | WL2 vol. VCC+6 V~VCC+9 V | SL1 vol. VCC−1.0 V~VCC−0.5 V | DNW vol. VCC |
| Different sectors, same BL, different SG (not selected) | BL1 vol. VCC−6.5 V~VCC−4.5 V | SG3/4 vol. VCC | WL3/4 vol. VCC−1.0 V~VCC−0.5 V | SL2 vol. VCC−1.0 V~VCC−0.5 V | DNW vol. VCC |
| Different sectors, different BL, different SG (not selected) | BL2/3 vol. VCC | SG3/4 vol. VCC | WL3/4 vol. VCC−1.0 V~VCC−0.5 V | SL2 vol. VCC−1.0 V~VCC−0.5 V | DNW vol. VCC |

Factors needed to be considered when setting and optimizing the program operating condition includes:

1. The program operating condition for the selected flash memory cell should match with the device characteristics of the flash memory cells, otherwise the program function cannot be realized. The characteristics of the select gate PMOS transistor and control gate PMOS transistor of the embedded 2T PMOS flash memory product using the 0.18 um to 55 nm manufacturing process nodes should be considered (see the description of section 1 of the factors considered in the second embodiment). Specifically, (1) the BL1/SG1 voltage difference should be sufficient to turn on the select gate PMOS transistor, to transmit the voltage of the BL1 (as shown in FIG. 2) to the other node of the select gate PMOS transistor (source node, which is also the drain node of the control gate PMOS transistor). (2) The voltage difference between the BL1 and the DNW should be moderate to ensure that the drain node of the control gate PMOS transistor works in the soft breakdown area during the program operation, thereby generating enough electron/hole pairs and avoiding a big leakage current. (3) The BL1/WL1 voltage difference should be moderate to maintain a longitudinal electric field strong enough to pull the electrons generated by the BL1/DNW soft breakdown into the floating gate but insufficient to pull the electrons in the floating gate further to the WL. Meanwhile, it should be ensured that the control gate transistor is fully turned off. (4) The BL1/SL1 voltage difference should be small enough to avoid the leakage between the source and drain of the control gate transistor. In consideration of the above factors and the main device characteristics of the high-voltage MOS devices, the determined program operating condition is as follows: "BL is VCC−6.5V~VCC−4.5V, SG is VCC−8.5V~VCC−6.5V, WL1 is VCC+6V~VCC+9V, SL1 is VCC−1.0V~VCC−0.5V, DNW is VCC".

2. For the non-selected flash memory cells, setting the program operating condition is to avoid interference to the flash memory cell selected for the program operation and the possible "mistaken programming". Table 3 classifies the non-selected flash memory cells into 5 states according to the structure of the real flash memory array: (1) For the flash memory cells in the same sector and having the same SG and different BLs, the BL voltage is pulled down to the VCC voltage to avoid the possible "mistaken programming", at this time the BL2, BL3 and the DNW have the same voltage such that no electron/hole pair can be generated. (2) For the flash memory cells in the same sector and having the same BL and different SGs, the SG2 voltage is pulled up to the VCC voltage to fully turn off the select gate PMOS transistor to avoid the possible "mistaken programming", at this time the negative voltage of the BL1 can not be transmitted to the drain node of the control gate transistor. (3) The bias voltage configuration of the flash memory cells in the same sector and having different BLs and SGs depends on the condition as specified in states (1) and (2); (4) The flash memory cells in different sectors are similarly biased with reference to the manner specified in state (1) and (2).

3. The non-selected cells should be properly configured to avoid adversely affecting the reliability of the flash memory product as much as possible. The main factors considered is the electric stress born by the non-selected flash memory cell at the BL1. To address such problem, the voltage different between the drain node BL1 of the select gate PMOS transistor and the DNW is 4.5~6.5V, and the voltage difference between the drain node BL1 of the select gate PMOS transistor and the SG voltage is 6.5V~8.5V, which corresponds to the bias condition of the GIDL. Thus, to reduce the electric stress and improve the reliability of the product, the voltage of the BL should be as close to the VCC voltage as possible. This requirement conflicts with the program efficiency required for the selected cell, thus there is a tradeoff therebetween.

The method embodiments of the invention can be implemented in the manner of software, hardware, firmware or the combination thereof. Whether the invention is implemented in the manner of software, hardware or firmware, the instruction code can be stored in any type of computer accessible memories (e.g. permanent or revisable, volatile or non-volatile, solid or non-solid, fixed or interchangeable mediums, etc.). Furthermore, the memory can be, for example, programmable array logic ("PAL"), random access memory ("RAM"), programmable read only memory ("PROM"), read-only memory ("ROM"), electrically erasable programmable ROM ("EEPROM"), magnetic disc, optical disc, digital versatile disc ("DVD") and so on.

It should be noted that correlation terms such as first, second, etc. in the claims and specification of the invention are merely used to distinguish an entity or operation from another entity or operation, and it is not required or implicitly indicated that there is any real correlation or sequence between these entities or operations. Furthermore, the terms "include", "comprise' or other variations thereof are intended to refer to non-exclusive encompass, thereby the process, method, article or device having a series of features does not merely include those features but also other features not explicitly recited, or further includes inherent features of such process, method, article or device. Without further limitation, the features defined by the phrase "comprise a" does not exclude that the process, method, article or device further comprises other identical features.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A method for programming a flash memory comprising an array of at least one sector, each sector comprising an N-type well and a plurality of flash memory cells coupled in a matrix in the N-type well, wherein
    each flash memory cell comprises a select gate PMOS transistor and a control gate PMOS transistor with a floating gate, and a first electrode of the select gate PMOS transistor is coupled to a second electrode of the control gate PMOS transistor;
    in the matrix coupled by the flash memory cells, the second electrodes of the select gate PMOS transistors in the same column are coupled together to form a first control line, and gates of the control gate PMOS transistors in the same row are coupled together to form a second control line; and
    the select gate PMOS transistor has a gate oxide layer with a thickness of 8 nm to 11 nm and a channel with a length of 100 nm to 300 nm; the control gate PMOS transistor has a gate oxide with a thickness of 8 nm to 11 nm, an ONO thin film dielectric layer with a thickness of 10 nm to 20 nm and a channel with a length of 100 nm to 300 nm;
    the method comprises:
    when performing a program operation, applying to the first control line of a flash memory cell selected for the program operation a voltage ranging from a VCC voltage minus 6.5 V to the VCC voltage minus 4.5 V, and applying to the second control line of the selected flash memory cell a voltage ranging from the VCC voltage plus 6V to the VCC voltage plus 9V;
    wherein the first electrode is a source and the second electrode is a drain, or the first electrode is the drain and the second electrode is the source.

2. The method for programming the flash memory of claim 1, wherein gates of the select gate PMOS transistors in the same row in the matrix coupled by the flash memory cells are coupled together to form a third control line, and the first electrodes of the control gate PMOS transistors in the same sector are coupled together to form a fourth control line;
    the method further comprises:
    when performing the program operation, applying the VCC voltage to the N-type well of each sector, applying to the third control line of the selected flash memory cell a voltage ranging from the VCC voltage minus 8.5V to the VCC voltage minus 6.5V, and applying to the fourth control line of the selected flash memory cell a voltage ranging from the VCC voltage minus 1V to the VCC voltage minus 0.5V.

3. The method for programming the flash memory of claim 2, wherein when performing the program operation, for a flash memory cell not selected for the program operation, applying the VCC voltage to its first control line, applying to its second control line a voltage ranging from the VCC voltage plus 6V to the VCC voltage plus 9V, applying to its third control line a voltage ranging from the VCC voltage minus 8.5V to the VCC voltage minus 6.5V, and applying to its fourth control line a voltage ranging from the VCC voltage minus 1V to the VCC voltage minus 0.5V,
    and wherein the non-selected flash memory cell and the selected flash memory cell are in the same sector, and are coupled to the same third control line and to different first control lines.

4. The method for programming the flash memory of claim 2, wherein when performing the program operation, for a flash memory cell not selected for the program operation, applying to its first control line a voltage ranging from the VCC voltage minus 6.5V to the VCC voltage minus 4.5V, applying to its second control line a voltage ranging from the VCC voltage plus 6V to the VCC voltage plus 9V, applying the VCC voltage to its third control line, and applying to its fourth control line a voltage ranging from the VCC voltage minus 1V to the VCC voltage minus 0.5V, and wherein the non-selected flash memory cell and the selected flash memory cell are in the same sector, and are coupled to the same first control line and to different third control lines.

5. The method for programming the flash memory of claim 2, wherein when performing the program operation, for a flash memory cell not selected for the program operation, applying the VCC voltage to its first and third control lines, applying to its second control line a voltage ranging from the VCC voltage plus 6V to the VCC voltage plus 9V, and applying to its fourth control line a voltage ranging from the VCC voltage minus 1V to the VCC voltage minus 0.5V, and wherein the non-selected flash memory cell and the selected flash memory cell are in the same sector, and are coupled to different first control lines and to different third control lines.

6. The method for programming the flash memory of claim 2, wherein the matrix coupled by the flash memory cells comprises at least two sectors, and the method further comprises:

when performing the program operation, for a flash memory cell not selected for the program operation, applying to its first control line a voltage ranging from the VCC voltage minus 6.5V to the VCC voltage minus 5V, applying the VCC voltage to its third control line, and applying to its second and fourth control lines a voltage ranging from the VCC voltage minus 1V to the VCC voltage minus 0.5V, and wherein the non-selected flash memory cells and the selected flash memory cell are not in the same sector, and are coupled to the same first control line and to different third control lines.

7. The method for programming the flash memory of claim 2, wherein the matrix coupled by the flash memory cells comprises at least two sectors, and the method further comprises:

when performing the program operation, for a flash memory cell not selected for the program operation, applying the VCC voltage to its first and third control lines, and applying to its second and fourth control lines a voltage ranging from the VCC voltage minus 1V to the VCC voltage minus 0.5V, and wherein the non-selected flash memory cells and the selected flash memory cell are not in the same sector, and are coupled to different first control lines and to different third control lines.

8. The method for programming the flash memory of claim 2, wherein the VCC voltage is 1.0V to 2.5V.

9. The method for programming the flash memory of claim 1, wherein the select gate PMOS transistor has a drain breakdown voltage of 8 to 15 V; the floating gate of the control gate PMOS transistor has a doping concentration greater than $1\times10^{20}$ cm$^{-3}$ and a thickness of 20 to 100 nm, and the control gate PMOS transistor has a drain breakdown voltage of 8 to 15 V.

10. The method for programming the flash memory of claim 2, wherein the matrix coupled by the flash memory cells comprises at least two sectors, for the select gate PMOS transistor, its gate oxide layer has a thickness of 10 to 11 nm and its channel has a thickness of 195 to 300 nm, and the select gate PMOS transistor has a drain breakdown voltage of 8 to 10 V; for the control gate PMOS transistor, its gate oxide layer has a thickness of 10 to 11 nm, its channel has a thickness of 165 to 260 nm, its ONO thin film dielectric layer has a thickness of 10 to 20 nm, and its floating gate has a doping concentration greater than $3\times10^{20}$ cm$^{-3}$ and a thickness of 20 to 100 nm, and the control gate PMOS transistor has a drain breakdown voltage of 8 to 10 V;

the method further comprises:

when performing the program operation, applying the VCC voltage to the N-type well of each sector, for a flash memory cell selected for the program operation, applying a voltage of 6.1V lower than the VCC voltage to its first control line, applying a voltage of 8.8V higher than the VCC voltage to its second control line, applying a voltage of 8.1V lower than the VCC voltage to its third control line, and applying a voltage of 0.8V lower than the VCC voltage to its fourth control line;

for a flash memory cell not selected for the program operation, applying the VCC voltage to its first control line, applying a voltage of 8.8V higher than the VCC voltage to its second control line, applying a voltage of 8.1V lower than the VCC voltage to its third control line, and applying a voltage of 0.8V lower than the VCC voltage to its fourth control line, and wherein the non-selected flash memory cell and the selected flash memory cell are in the same sector, and coupled to the same third control line and to different first control lines;

for a flash memory cell not selected for the program operation, applying a voltage of 6.1V lower than the VCC voltage to its first control line, applying a voltage of 8.8V higher than the VCC voltage to its second control line, applying the VCC voltage to its third control line, and applying a voltage of 0.8V lower than the VCC voltage to its fourth control line, and wherein the non-selected flash memory cells and the selected flash memory cell are in the same sector, and coupled to the same first control line and to different third control lines;

for a flash memory cell not selected for the program operation, applying the VCC voltage to its first and third control lines, applying a voltage of 8.8V higher than the VCC voltage to its second control line, applying a voltage of 0.8V lower than the VCC voltage to its fourth control line, and wherein the non-selected flash memory cells and the selected flash memory cell are in the same sector, and coupled to different first control lines and to different third control lines;

for a flash memory cell not selected for the program operation, applying a voltage of 6.1V lower than the VCC voltage to its first control line, applying the VCC voltage to its third control line, applying a voltage of 0.8V lower than the VCC voltage to its second and fourth control lines, and wherein the non-selected flash memory cells and the selected flash memory cell are in different sectors, and coupled to the same first control line and to different third control lines; or for a flash memory cell not selected for the program operation, applying the VCC voltage to its first and third control lines, and applying a voltage of 0.8V lower than the VCC voltage to its second and fourth control lines, and wherein the non-selected flash memory cells and the selected flash memory cell are in different sectors, and coupled to different first control lines and to different third control lines.

* * * * *